United States Patent
Sasaki et al.

(10) Patent No.: US 11,545,618 B2
(45) Date of Patent: Jan. 3, 2023

(54) SPIN ELEMENT AND RESERVOIR ELEMENT INCLUDING HIGH RESISTANCE LAYER

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 210 days.

(21) Appl. No.: 16/959,690

(22) PCT Filed: Jan. 24, 2020

(86) PCT No.: PCT/JP2020/002500
§ 371 (c)(1),
(2) Date: Jul. 2, 2020

(87) PCT Pub. No.: WO2021/149241
PCT Pub. Date: Jul. 29, 2021

(65) Prior Publication Data
US 2021/0399210 A1    Dec. 23, 2021

(51) Int. Cl.
| | | |
|---|---|---|
| *H01L 43/04* | (2006.01) | |
| *H01L 27/22* | (2006.01) | |
| *H01L 43/06* | (2006.01) | |
| *G06N 3/063* | (2006.01) | |

(52) U.S. Cl.
CPC ............ *H01L 43/04* (2013.01); *H01L 27/228* (2013.01); *H01L 43/06* (2013.01); *G06N 3/063* (2013.01)

(58) Field of Classification Search
CPC ....... H01L 43/04; H01L 27/228; H01L 43/06; H01L 29/82; H01L 43/08; G06N 3/063

USPC .......................................................... 257/421
See application file for complete search history.

(56) References Cited

U.S. PATENT DOCUMENTS

| | | | |
|---|---|---|---|
| 8,350,347 B2 | 1/2013 | Gaudin et al. | |
| 2005/0104102 A1* | 5/2005 | Fukuzumi | B82Y 10/00 257/E27.005 |
| 2011/0129691 A1 | 6/2011 | Ishiwata et al. | |
| 2012/0211811 A1* | 8/2012 | Nagahara | H01L 27/228 257/295 |
| 2014/0056060 A1* | 2/2014 | Khvalkovskiy | G11C 11/1675 365/158 |

(Continued)

FOREIGN PATENT DOCUMENTS

| | | |
|---|---|---|
| JP | 5441005 B2 | 3/2014 |
| JP | 2016-021530 A | 2/2016 |

(Continued)

OTHER PUBLICATIONS

Kato, Y. K. et al. "Observation of the Spin Hall Effect in Semiconductors". Science, vol. 306, pp. 1910-1913, 2004.

(Continued)

*Primary Examiner* — Duy T Nguyen
(74) *Attorney, Agent, or Firm* — Oliff PLC

(57) ABSTRACT

A spin element includes a wiring, a laminated body including a first ferromagnetic layer laminated on the wiring, a first conductive part and a second conductive part which sandwich the first ferromagnetic layer in a plan view in a laminating direction, and a first high resistance layer which is in contact with the wiring between the first conductive part and the wiring and has an electrical resistivity equal to or higher than that of the wiring.

11 Claims, 8 Drawing Sheets

(56) References Cited

U.S. PATENT DOCUMENTS

| | | | |
|---|---|---|---|
| 2015/0348606 A1 | 12/2015 | Buhrman et al. | |
| 2016/0020207 A1 | 1/2016 | Tsuchiya et al. | |
| 2017/0222135 A1 | 8/2017 | Fukami et al. | |
| 2018/0222135 A1 | 8/2018 | Dias Borges Vianna et al. | |
| 2019/0189516 A1 | 6/2019 | Sasaki et al. | |
| 2020/0136017 A1* | 4/2020 | Ashida | H01L 29/82 |
| 2021/0151665 A1* | 5/2021 | Komura | H01L 27/222 |
| 2021/0364580 A1* | 11/2021 | Tsumita | G11C 11/1659 |

FOREIGN PATENT DOCUMENTS

| | | |
|---|---|---|
| JP | 2017-216286 A | 12/2017 |
| JP | 6620915 B1 | 12/2019 |
| WO | 2016/021468 A1 | 2/2016 |
| WO | 2018/189964 A1 | 10/2018 |
| WO | 2019/171715 A1 | 9/2019 |

OTHER PUBLICATIONS

Miron, Ioan Mihai et al. "Perpendicular switching of a single ferromagnetic layer induced by in-plane current injection". Nature, vol. 476, pp. 189-194, 2011.

Liu, Luqiao et al. "Spin torque switching with the giant spin Hall effect of tantalum". Science, 2012.

Liu, Luqiao et al. "Current-Induced Switching of Perpendicularly Magnetized Magnetic Layers Using Spin Torque from the Spin Hall Effect". Physical Review Letters, vol. 109, pp. 096602-1-096602-5, 2012.

Lee, Ki-Seung et al. "Threshold current for switching of a perpendicular magnetic layer induced by spin Hall effect". Applied Physics Letters, vol. 102, pp. 112410-1-112410-5, 2013.

Lee, Ki-Seung et al. "Thermally activated switching of perpendicular magnet by spin-orbit spin torque". Applied Physics Letters, vol. 104, pp. 072413-1-072413-5, 2014.

Fukami, Shunsuke et al. "Magnetization switching by spin-orbit torque in an antiferromagnet-ferromagnet bilayer system". Nature Materials, vol. 15, pp. 535-542, 2016.

Fukami, Shunsuke et al. "A spin-orbit torque switching scheme with collinear magnetic easy axis and current configuration". Nature Nanotechnology, pp. 1-6, 2016.

Takahashi, S. et al. "Spin injection and detection in magnetic nanostructures". Physical Review B, vol. 67, pp. 352409-1-052409-4, 2003.

Seo, Yeongkyo et al. "Area-Efficient SOT-MRAM With a Schottky Diode". IEEE Electron Device Letters, vol. 37, No. 8, pp. 982-985, 2016.

Zhang, Wei et al. "Spin Hall Effects in Metallic Antiferromagnets". Physical Review Letters, vol. 113, pp. 196602-1 to 196602-6, 2014.

Sato, H. et al. "Perpendicular-anisotropy CoFeB—MgO magnetic tunnel junctions with a MgO/CoFeB/Ta/CoFeB/MgO recording structure". Applied Physics Letters, vol. 101, pp. 022414-1 -022414-4, 2012.

Liu, Luqiao et al. "Magnetic Oscillations Driven by the Spin Hall Effect in 3-Terminal Magnetic Tunnel Junction Devices". Physical Review Letters, vol. 109, pp. 186602-1-186602-5, 2012.

Kimura, Takashi et al. "Electrical Control of the Direction of Spin Accumulation". Physical Review Letters, vol. 99, pp. 166601-1-166601-4, 2007.

Yu, Guoqiang et al. "Switching of perpendicular magnetization by spin-orbit torques in the absence of external magnetic fields". Nature Nanotechnology, vol. 9, pp. 548-554, 2014.

* cited by examiner

SPIN ELEMENT AND RESERVOIR ELEMENT INCLUDING HIGH RESISTANCE LAYER

FIELD

The present invention relates to a spin element and a reservoir element.

BACKGROUND ART

Next-generation non-volatile memories that will replace flash memories, which have reached their limit of miniaturization, are gathering attention. For example, a magnetoresistive random access memory (MRAM), a resistance random access memory (ReRAM), a phase change random memory (PCRAM) and the like are known as next generation non-volatile memories.

An MRAM is a memory element using a magnetoresistance effect element. A resistance value of the magnetoresistance effect element changes according to a difference in a relative angle between magnetization directions of two magnetic films. The MRAM records the resistance value of the magnetoresistance effect element as data.

Among spin elements using a magnetoresistance change, a spin orbit torque (SOT) type magnetoresistance effect element using an SOT (for example, Patent Document 1) and a magnetic domain wall movement type magnetic recording element using movement of a magnetic domain wall (for example, Patent Document 2) are gathering attention. These spin elements are connected to and controlled by semiconductor elements such as transistors through a wiring. For example, Patent Document 3 describes that electromigration resistance of a wiring is improved by forming a barrier metal film on the wiring in a semiconductor device.

CITATION LIST

Patent Literature

[Patent Document 1]
  Japanese Unexamined Patent Application, First Publication No. 2017-216286
[Patent Document 2]
  Japanese Patent No. 5441005
[Patent Document 3]
  Japanese Unexamined Patent Application, First Publication No. 2016-21530

SUMMARY

Technical Problem

A material of the wiring used for the spin element may be limited. For example, in the case of the spin orbit torque type magnetoresistance effect element, a heavy metal is often used for the wiring in order to inject many spins into a ferromagnetic layer. Further, for example, in the case of the magnetic domain wall movement type magnetic recording element, the wiring needs to be a magnetic film. Therefore, the material of the wiring which constitutes the spin element and the material of the wiring which connects together the elements are different, and resistivities thereof are different. An electric potential is concentrated in a boundary portion in which the resistivities are different, and thus the wiring is likely to deteriorate.

The present invention has been made in view of the above problems, and an object thereof is to provide a spin element and a reservoir element in which concentration of electric potential in a certain place is curbed and deterioration of a wiring is curbed.

Solution to Problem (1) A spin element according to a first aspect includes a wiring, a laminated body including a first ferromagnetic layer laminated on the wiring, a first conductive part and a second conductive part which sandwich the first ferromagnetic layer in a plan view in a laminating direction, and a first high resistance layer which is in contact with the wiring between the first conductive part and the wiring and has an electrical resistivity equal to or higher than that of the wiring.

(2) In the spin element according to the aspect, a perimeter of the first high resistance layer may be smaller than a perimeter of the first conductive part, and the first high resistance layer may be included in the first conductive part in a plan view in the laminating direction.

(3) In a spin element according to a second aspect, a perimeter of the first high resistance layer may be smaller than a perimeter of the first conductive part, and a center of the first high resistance layer may be closer to the first ferromagnetic layer than a center of the first conductive part in a plan view in the laminating direction.

(4) In the spin element according to the aspect, materials which constitute the first high resistance layer and the wiring may be the same.

(5) In the spin element according to the aspect, in a second direction orthogonal to a first direction in which the wiring extends and the laminating direction, a width of the wiring may be narrower than that of the first high resistance layer in the second direction.

(6) In the spin element according to the aspect, an interface between the first high resistance layer and the wiring may have unevenness of one atomic layer or more.

(7) In the spin element according to the aspect, a thickness of the first high resistance layer at a first point may be thicker than a thickness thereof at a second point farther from the first ferromagnetic layer than the first point.

(8) The spin element according to the aspect may further include a second high resistance layer which is in contact with the wiring between the second conductive part and the wiring and has an electrical resistivity equal to or higher than that of the wiring.

(9) In the spin element according to the aspect, the laminated body may be formed of the first ferromagnetic layer, and the wiring may be any one of a metal, an alloy, an intermetallic compound, a metal boride, a metal carbide, a metal silicide, and a metal phosphide which have a function of generating a spin current by a spin Hall effect when a current flows.

(10) In the spin element according to the aspect, the laminated body may include the first ferromagnetic layer, a nonmagnetic layer, and a second ferromagnetic layer from a side close to the wiring, and the wiring may be any one of a metal, an alloy, an intermetallic compound, a metal boride, a metal carbide, a metal silicide, and a metal phosphide which have a function of generating a spin current by a spin Hall effect when a current flows.

(11) In the spin element according to the aspect, the laminated body may include a nonmagnetic layer, and the first ferromagnetic layer from a side close to the wiring, and the wiring may be a ferromagnetic layer which is able to have a magnetic domain wall therein.

(12) A reservoir element according to a second aspect includes a plurality of spin elements according to the aspect, and a spin conductive layer which connects the first ferromagnetic layers of the plurality of spin elements.

Advantageous Effects of Invention

In the spin element and the reservoir element according to the above-described aspect, the wiring is unlikely to deteriorate.

DESCRIPTION OF EMBODIMENTS

Figure 1:
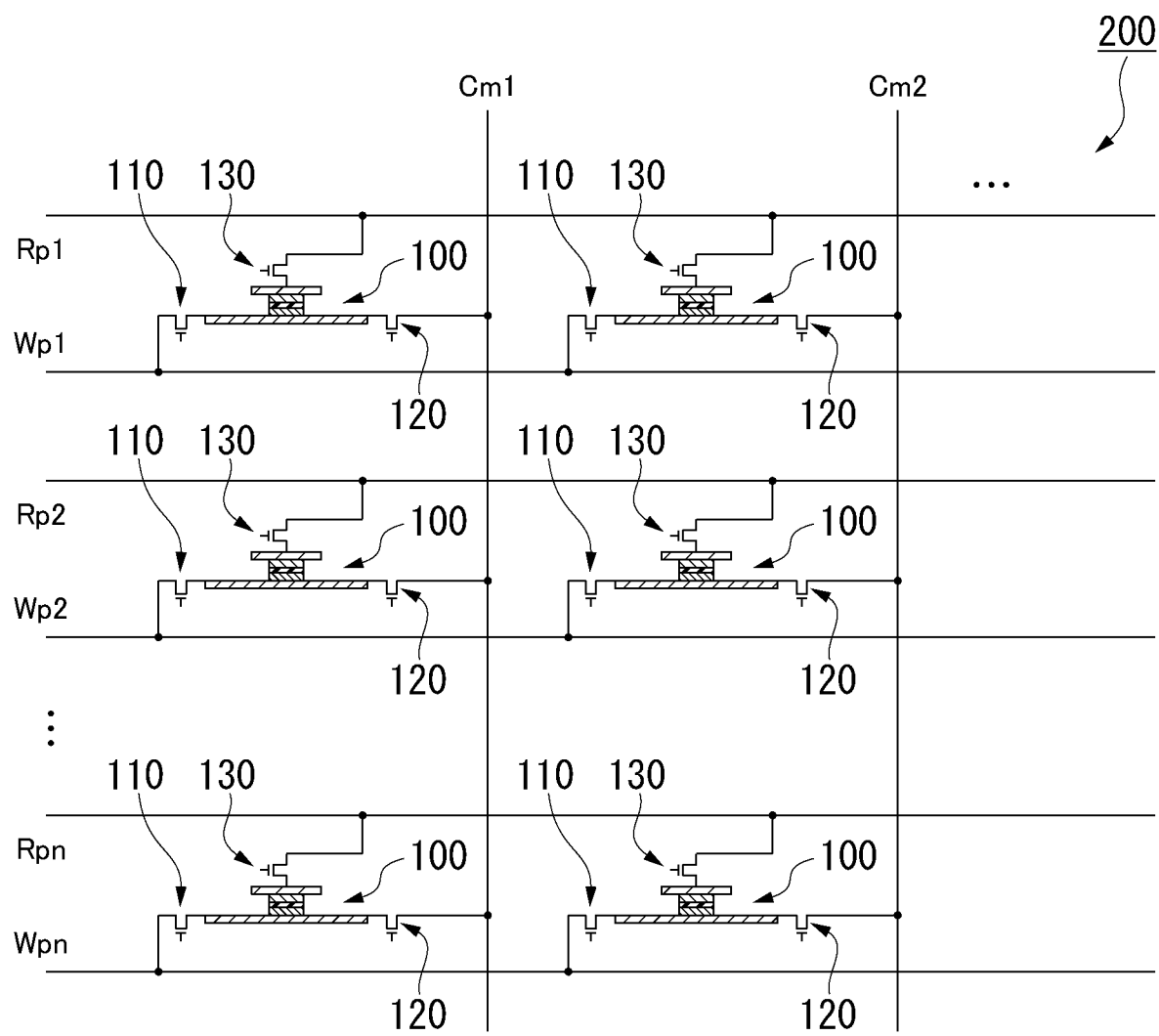
FIG. 1 is a schematic diagram of a magnetic recording array according to a first embodiment.

Hereinafter, embodiments of the present invention will be described in detail with reference to the drawings. In the drawings used in the following description, in order to make features easy to understand, the features may be enlarged for convenience, and dimensional ratios of components may be different from actual ones. Materials, dimensions, and the like provided in the following description are exemplary examples, and the present invention is not limited thereto and can be appropriately modified and implemented within a range in which effects of the present invention are exhibited.

First, directions will be defined. One direction of one surface of a substrate Sub (refer to FIG. 2) which will be described later is defined as an x direction, and a direction orthogonal to the x direction is defined as a y direction. The x direction is a direction in which a wiring 20 which will be described later extends and is a lengthwise direction in the wiring 20. The x direction is an example of a first direction. The y direction is an example of the second direction. A z direction is a direction orthogonal to the x direction and the y direction. The z direction is an example of a laminating direction. Hereinafter, a +z direction may be expressed as "upward" and a −z direction may be expressed as "downward." The upward and downward directions do not necessarily correspond to the direction in which gravity is applied.

In the specification, "extending in the x direction" means that a dimension in the x direction is larger than a minimum dimension among the respective dimensions in the x direction, the y direction, and the z direction. The same applies to extension in other directions.

First Embodiment

FIG. 1 is a constitution diagram of a magnetic recording array 200 according to a first embodiment. The magnetic recording array 200 includes a plurality of magnetoresistance effect elements 100, a plurality of write wirings Wp1 to Wpn, a plurality of common wirings Cm1 to Cmn, a plurality of read wirings Rp1 to Rpn, a plurality of first switching elements 110, a plurality of second switching elements 120, and a plurality of third switching elements 130. The magnetic recording array 200 can be used, for example, in a magnetic memory or the like. The magnetoresistance effect element 100 is an example of a spin element.

Each of the write wirings Wp1 to Wpn electrically connects a power supply to one or more magnetoresistance effect elements 100. The common wirings Cm1 to Cmn are wirings used when data is written and read. Each of the common wirings Cm1 to Cmn electrically connects an electric reference potential to one or more magnetoresistance effect elements 100. The reference electric potential is, for example, ground. Each of the common wirings Cm1 to Cmn may be disposed in each of the plurality of magnetoresistance effect elements 100 or may be disposed over the plurality of magnetoresistance effect elements 100. Each of the read wirings Rp1 to Rpn electrically connects the power supply to one or more magnetoresistance effect elements 100. The power supply is connected to the magnetic recording array 200 during use.

The first switching element 110, the second switching element 120, and the third switching element 130 shown in FIG. 1 are connected to the respective magnetoresistance effect elements 100. The first switching element 110 is connected between the magnetoresistance effect element 100 and each of the write wirings Wp1 to Wpn. The second switching element 120 is connected between the magnetoresistance effect element 100 and each of the common wirings Cm1 to Cmn. The third switching element 130 is connected between the magnetoresistance effect element 100 and each of the read wirings Rp1 to Rpn.

When the first switching element 110 and the second switching element 120 are turned on, a write current flows between the write wiring Wp1 to Wpn and the common wiring Cm1 to Cmn connected to the predetermined magnetoresistance effect element 100. When the second switching element 120 and the third switching element 130 are turned on, a read current flows between the common wiring Cm1 to Cmn and the read wiring Rp1 to Rpn connected to the predetermined magnetoresistance effect element 100.

The first switching element 110, the second switching element 120, and the third switching element 130 are elements which control a flow of a current. For example, the first switching element 110, the second switching element 120, and the third switching element 130 are elements which use a transistor, a phase change of a crystal layer such as an ovonic threshold switch (OTS), an element which uses a change in a band structure such as a metal-insulator transition (MIT) switch, an element which uses a breakdown voltage such as a Zener diode and an avalanche diode, and an element of which the conductivity changes according to a change in atomic positions.

Any one of the first switching element 110, the second switching element 120, and the third switching element 130 may be shared by the magnetoresistance effect elements 100 connected to the same wiring. For example, when the first switching element 110 is shared, one first switching element 110 is disposed upstream of the write wirings Wp1 to Wpn. For example, when the second switching element 120 is shared, one second switching element 120 is disposed upstream of the common wirings Cm1 to Cmn. For example, when the third switching element 130 is shared, one third switching element 130 is disposed upstream of the read wirings Rp1 to Rpn.

Figure 2:
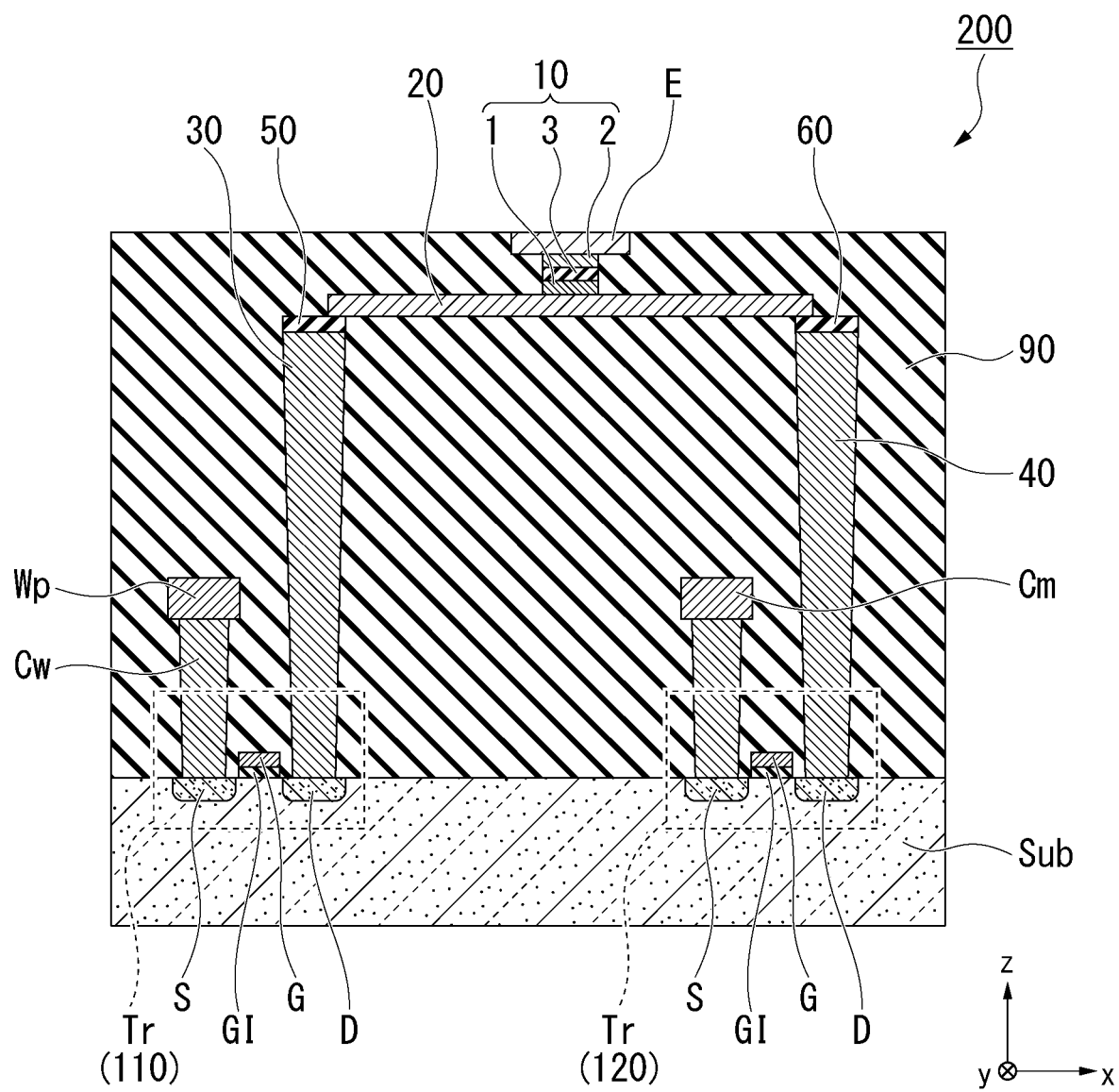
FIG. 2 is a cross-sectional view of a characteristic portion of the magnetic recording array according to the first embodiment.

FIG. 2 is a cross-sectional view of a characteristic part of the magnetic recording array 200 according to the first embodiment. FIG. 2 is a cross section of the magnetoresistance effect element 100 along an xz plane through a center of a width of the wiring 20, which will be described later, in the y direction.

The first switching element 110 and the second switching element 120 shown in FIG. 2 are transistors Tr. The third switching element 130 is electrically connected to a conductive layer E and is located, for example, in the y direction of FIG. 2. The transistor Tr is, for example, an electric field effect transistor and has a source S and a drain D formed in the substrate Sub, a gate electrode G, and a gate insulating film GI. The substrate Sub is, for example, a semiconductor substrate.

The transistor Tr and the magnetoresistance effect element 100 are electrically connected to each other through a first conductive part 30 and a first high resistance layer 50 or a second conductive part 40 and a second high resistance layer 60. Further, the transistor Tr and the write wiring Wp or the common wiring Cm are connected by a conductive part Cw. The first conductive part 30, the second conductive part 40, and the conductive part Cw may be referred to as connection wirings or via wirings, for example. The first conductive part 30, the second conductive part 40, and the conductive part Cw extend in the z direction, for example.

The periphery of the magnetoresistance effect element 100 and the transistor Tr is covered with an insulating layer 90. The insulating layer 90 is an insulating layer which insulates between wirings of a multilayer wiring and between elements. The insulating layer 90 is formed of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

Figure 3:
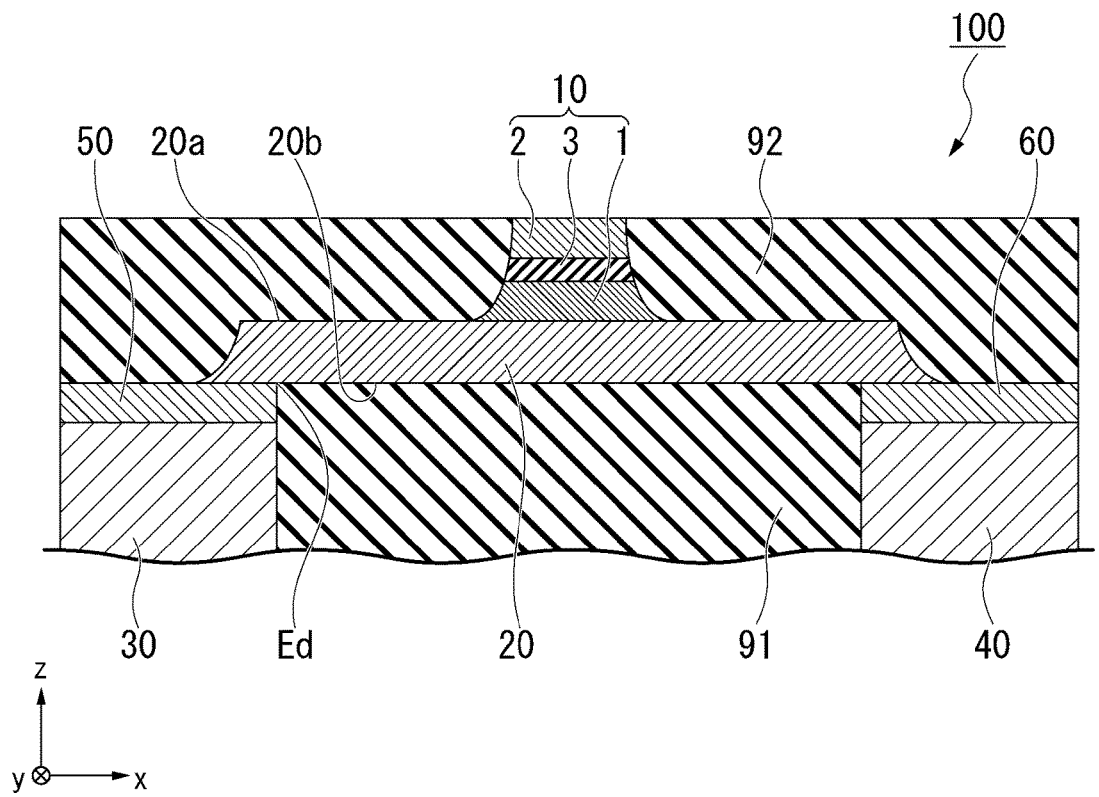
FIG. 3 is a cross-sectional view of a spin element according to the first embodiment.
Figure 4:
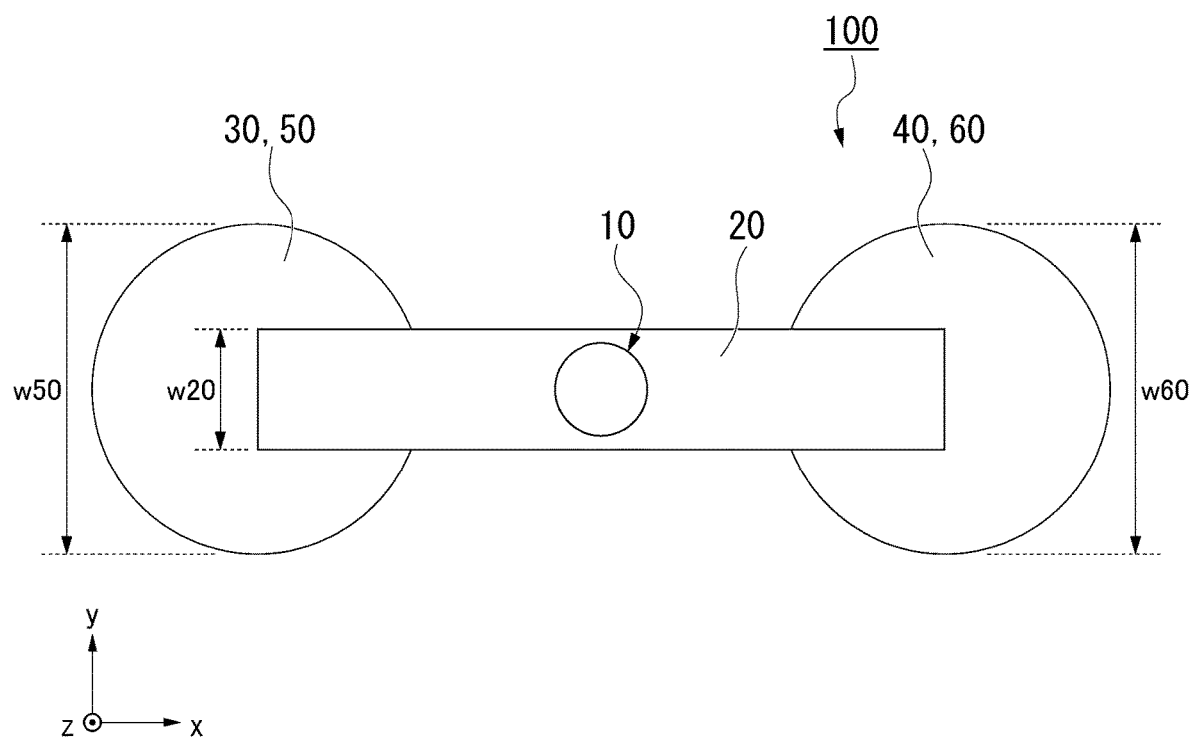
FIG. 4 is a plan view of the spin element according to the first embodiment.

FIG. 3 is a cross-sectional view of the magnetoresistance effect element 100 according to the first embodiment. FIG. 4 is a plan view of the magnetoresistance effect element 100 according to the first embodiment. FIG. 3 is a cross section of the magnetoresistance effect element 100 along the xz plane through the center of the width of the wiring 20 in the y direction.

The magnetoresistance effect element 100 includes a laminated body 10, the wiring 20, the first conductive part 30, the second conductive part 40, the first high resistance layer 50, and the second high resistance layer 60. An insulating layer 91 and an insulating layer 92 are parts of the insulating layer 90. A resistance value of the laminated body 10 in the z direction changes when a spin is injected from the wiring 20 into the laminated body 10. The magnetoresistance effect element 100 is a spin element using a spin orbit torque (SOT) and may be referred to as a spin orbit torque type magnetoresistance effect element, a spin injection type magnetoresistance effect element, or a spin current magnetoresistance effect element. Further, the wiring 20 may also be referred to as a spin orbit torque wiring.

The laminated body 10 is laminated on the wiring 20. Another layer may be disposed between the laminated body 10 and the wiring 20. The laminated body 10 is sandwiched between the wiring 20 and the conductive layer E in the z direction. The laminated body 10 is a columnar body. A shape of the laminated body 10 in a plan view in the z direction is, for example, a circle, an ellipse, or a quadrangle.

The laminated body 10 has a first ferromagnetic layer 1, a second ferromagnetic layer 2, and a nonmagnetic layer 3. The first ferromagnetic layer 1 is in contact with the wiring 20 and is laminated on the wiring 20, for example. The spin is injected from the wiring 20 into the first ferromagnetic layer 1. Magnetization of the first ferromagnetic layer 1 receives a spin orbit torque (SOT) due to the injected spin, and an orientation direction thereof changes. The second ferromagnetic layer 2 is in the z direction of the first ferromagnetic layer 1. The first ferromagnetic layer 1 and the second ferromagnetic layer 2 sandwich the nonmagnetic layer 3 in the z direction.

Each of the first ferromagnetic layer 1 and the second ferromagnetic layer 2 has magnetization. An orientation direction of the magnetization of the second ferromagnetic layer 2 is less likely to change than that of the magnetization of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. In the laminated body 10, the resistance value changes according to a difference in a relative angle between the magnetization of the first ferromagnetic layer 1 and the magnetization of the second ferromagnetic layer 2 which sandwich the nonmagnetic layer 3.

The first ferromagnetic layer 1 and the second ferromagnetic layer 2 include a ferromagnetic material. The ferromagnetic material includes, for example, a metal selected from the group consisting of Cr, Mn, Co, Fe and Ni, an alloy containing one or more of these metals, an alloy containing these metals and at least one or more of B, C, and N, or the like. The ferromagnetic material is, for example, Co—Fe, Co—Fe—B, Ni—Fe, a Co—Ho alloy, a Sm—Fe alloy, an Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X is a Co-, Fe-, Ni- or Cu-group transition metal element or noble metal element on the periodic table, Y is a Mn-, V-, Cr- or Ti-group transition metal or an element of X, and Z is a typical Group III to V element. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarization.

The laminated body 10 may have an antiferromagnetic layer on a surface of the second ferromagnetic layer 2 on the side thereof opposite to the nonmagnetic layer 3 via a spacer layer. The second ferromagnetic layer 2, the spacer layer, and the antiferromagnetic layer is a synthetic antiferromagnetic structure (SAF structure). The synthetic antiferromagnetic structure is constituted of two magnetic layers which sandwich a nonmagnetic layer. A coercivity of the second ferromagnetic layer 2 increases due to antiferromagnetic coupling between the second ferromagnetic layer 2 and the antiferromagnetic layer, as compared with a case in which the antiferromagnetic layer is not provided. The antiferromagnetic layer is, for example, IrMn, PtMn, or the like. The spacer layer includes, for example, at least one selected from the group consisting of Ru, 1r, and Rh.

The laminated body 10 may have layers other than the first ferromagnetic layer 1, the second ferromagnetic layer 2, and the nonmagnetic layer 3. For example, an underlayer may be disposed between the wiring 20 and the laminated body 10. The underlayer enhances crystallinity of each of the layers constituting the laminated body 10.

The wiring 20 is in contact with, for example, one surface of the laminated body 10. The wiring 20 is a write wiring for writing data in the magnetoresistance effect element 100. The wiring 20 extends in the x direction. At least a part of the wiring 20 sandwiches the first ferromagnetic layer 1 together with the nonmagnetic layer 3 in the z direction. An area of a first surface 20a of the wiring 20 far from the substrate Sub is smaller than an area of a second surface 20b opposite to the first surface 20a, for example. For example, the wiring 20 has a longer perimeter as it goes from the first surface 20a to the second surface 20b.

The wiring 20 generates a spin current by a spin Hall effect when a current I flows, and injects the spin into the first ferromagnetic layer 1. The wiring 20 applies, for example, a spin orbit torque (SOT) which can reverse the magnetization of the first ferromagnetic layer 1 to the magnetization of the first ferromagnetic layer 1. The spin Hall effect is a phenomenon in which a spin current is induced in a direction orthogonal to a current flow direction based on a spin orbit interaction when a current is flowed. The spin Hall effect is the same as a normal Hall effect in that a movement (traveling) direction of moving (traveling) charges (electrons) is bent. In the normal Hall effect, the movement direction of charged particles moving in a magnetic field is bent by a Lorentz force. On the other hand, in the spin Hall effect, even if there is no magnetic field, a movement direction of the spin is bent only due to the movement of electrons (only due to a flowing current).

For example, when the current I flows through the wiring 20, a first spin oriented in one direction and a second spin oriented in an opposite direction to the first spin are bent by the spin Hall effect in a direction orthogonal to a flow direction of the current I. For example, the first spin oriented in the −y direction is bent in the +z direction, and the second spin oriented in the +y direction is bent in the −z direction.

In a nonmagnetic material (a material which is not a ferromagnetic material), the number of electrons of the first spin and the number of electrons of the second spin generated by the spin Hall effect are equal. That is, the number of electrons of the first spin in the +z direction is equal to the number of electrons of the second spin in the −z direction. The first spin and the second spin are induced in a direction in which uneven distribution of the spins is eliminated. In the movement of the first spin and the second spin in the z direction, since the flows of charges are offset from each other, the amount of current becomes zero. The spin current without an electric current is particularly referred to as a pure spin current.

When a flow of electrons in the first spin is $J_\uparrow$, a flow of electrons in the second spin is $J_\downarrow$, and the spin current is $J_S$, $J_S = J_\uparrow - J_\downarrow$. The spin current $J_S$ is generated in the z direction. The first spin is injected into the first ferromagnetic layer 1 from the wiring 20.

The wiring 20 includes any one of a metal, an alloy, an intermetallic compound, a metal boride, a metal carbide, a metal silicide, and a metal phosphide which have a function of generating a spin current by the spin Hall effect when the current i flows.

The wiring 20 includes, for example, a nonmagnetic heavy metal as a main element. The main element is an element having the highest proportion of elements forming the wiring 20. The wiring 20 includes, for example, a heavy metal having a specific gravity equal to or greater than that of yttrium (Y). Since the nonmagnetic heavy metal has an atomic number equal to or larger than an atomic number of 39 and has d or f electrons in the outermost shell, the spin orbit interaction strongly occurs. The spin Hall effect is caused by the spin orbit interaction, the spins are likely to be unevenly distributed in the wiring 20, so that the spin current is easily generated. The wiring 20 includes, for example, any one selected from the group consisting of Au, Hf, Mo, Pt, W, and Ta.

The wiring 20 may include a magnetic metal. The magnetic metal is a ferromagnetic metal or an antiferromagnetic metal. A small amount of magnetic metal contained in the nonmagnetic material is a cause of scattering of spins. The small amount is, for example, 3% or less of the total of molar ratios of the elements constituting the wiring 20. When the spins are scattered by the magnetic metal, the spin orbit interaction is enhanced, and efficiency of generation of the spin current with respect to the electric current is increased.

The wiring 20 may include a topological insulator. A topological insulator is a material of which the interior is an insulator or a high resistance body, and a spin-polarized metal state is generated on a surface thereof. An internal magnetic field is generated in the topological insulator by the spin orbit interaction. In the topological insulator, a new topological phase develops due to the effect of the spin orbit interaction even in the case where there is no external magnetic field. The topological insulator can generate a pure spin current with high efficiency due to a strong spin orbit interaction and breaking of inversion symmetry at an edge.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, or $(Bi_{1-x}Sb_x)_2Te_3$. The topological insulator can generate a spin current with high efficiency.

The first conductive part 30 and the second conductive part 40 sandwich the laminated body 10 in the x direction in a plan view in the z direction. The first conductive part 30 and the second conductive part 40 are wirings which connect the magnetoresistance effect element 100 to the transistors Tr. The first conductive part 30 and the second conductive part 40 electrically connect, for example, elements or wirings in different layers.

The first conductive part 30 and the second conductive part 40 are formed of a material having excellent conductivity. The first conductive part 30 and the second conductive part 40 include, for example, any one selected from the group consisting of Ag, Cu, Co, Al, and Au.

The first high resistance layer 50 is between the wiring 20 and the first conductive part 30 and is in contact with the wiring 20. The second high resistance layer 60 is between the wiring 20 and the second conductive part 40 and is in contact with the wiring 20. The first high resistance layer 50 and the second high resistance layer 60 reduce local concentration of an electric potential. A side surface of the first high resistance layer 50 shown in FIG. 3 is continuous with a side surface of the first conductive part 30, and a side surface of the second high resistance layer 60 is continuous with a side surface of the second conductive part 40. For example, when the first conductive part 30 and the first high resistance layer 50 are formed in one opening formed in the insulating layer 91, the side surfaces thereof are continuous with each other.

The first high resistance layer 50 and the second high resistance layer 60 each have an electrical resistivity equal to or higher than that of the wiring 20. The electrical resistivity of each of the first high resistance layer 50 and the second high resistance layer 60 is, for example, equal to or higher than that of the wiring 20 and lower than that of the insulator. The electrical resistivity of each of the first high resistance layer 50 and the second high resistance layer 60 is, for example, $1.0 \times 10^{-7}$ Ωm or more and $1.0 \times 10^{-4}$ Ωm or less, preferably $1.0 \times 10^{-6}$ Ωm or more and $1.0 \times 10^{-5}$ Ωm or less, more preferably $3.0 \times 10^{-6}$ Ωm or more and $1.0 \times 10^{-5}$ Ωm or less at room temperature (20° C.).

The first high resistance layer 50 and the second high resistance layer 60 include a material which satisfies the above-described electrical resistivity relationship. The first high resistance layer 50 and the second high resistance layer 60 are, for example, W and Ta. The first high resistance layer 50 and the second high resistance layer 60 may be formed of the same material as the wiring 20. When the first high resistance layer 50 and the second high resistance layer 60 are formed of the same material as the wiring 20, the electrical resistivity of each of the first high resistance layer 50 and the second high resistance layer 60 is the same as that of the wiring 20. The wiring 20, the first high resistance layer 50, and the second high resistance layer 60 can be collectively regarded as a wiring which includes a main part extending in an in-plane direction and a protruding part protruding from the main part. The first high resistance layer 50 and the second high resistance layer 60 may be formed of the same material or may be formed of different materials.

A width w50 of the first high resistance layer 50 in the y direction and a width w60 of the second high resistance layer 60 in the y direction are, for example, wider than a width of the wiring 20 in the y direction. When a contact area between the wiring 20 and the first high resistance layer 50 or the second high resistance layer 60 increases, it is possible to curb accumulation of heat at an interface between the wiring 20 and the first high resistance layer 50 and an interface between the wiring 20 and the second high resistance layer 60. The heat promotes element diffusion and causes deterioration of the wiring.

The interface between the first high resistance layer 50 and the wiring and the interface between the second high resistance layer 60 and the wiring 20 may each have unevenness of one atomic layer or more. The unevenness of the interfaces between the first high resistance layer 50 and the wiring and the interface between the second high resistance layer 60 and the wiring 20 is preferably half or less of a thickness of the wiring 20. When these interfaces have unevenness, the current density of the current passing through the interfaces is reduced, local concentration of the current is curbed, and electromigration can be curbed.

Next, a method of manufacturing the magnetoresistance effect element 100 will be described. The magnetoresistance effect element 100 is formed by a laminating step of each of the layers and a processing step of processing a part of each of the layers into a predetermined shape. For laminating each of the layers, a sputtering method, a chemical vapor deposition (CVD) method, an electron beam evaporation method (EB evaporation method), an atomic laser deposition method, or the like can be used. The processing of each of the layers can be performed using photolithography or the like.

First, impurities are doped at predetermined positions on the substrate Sub to form the source S and the drain D. Next, the gate insulating film GI and the gate electrode G are formed between the source S and the drain D. The source S, the drain D, the gate insulating film GI, and the gate electrode G become the transistor Tr.

Next, the insulating layer 91 is formed to cover the transistor Tr. Further, the first conductive part 30, the second conductive part 40, the first high resistance layer 50, the second high resistance layer 60, and the conductive part Cw are formed by forming an opening part in the insulating layer 91 and filling the opening part with a conductor. The write wiring Wp and the common wiring Cm are formed by laminating the insulating layer 91 to a predetermined thickness, forming a groove in the insulating layer 91 and then filling the groove with a conductor.

Next, a wiring layer, a ferromagnetic layer, a nonmagnetic layer, and a ferromagnetic layer are sequentially laminated on surfaces of the insulating layer 91, the first high resistance layer 50, and the second high resistance layer 60. Next, the wiring layer is processed into a predetermined shape. The wiring layer becomes the wiring 20 by being processed into a predetermined shape. Then, a laminated body formed on the wiring layer is processed into a predetermined shape to form the laminated body 10, and thus the magnetoresistance effect element 100 can be manufactured.

Next, an operation of the magnetoresistance effect element 100 according to the first embodiment will be described. The magnetoresistance effect element 100 has a data write operation and a data read operation.

First, an operation of recording data in the magnetoresistance effect element 100 will be described. First, the first switching element 110 and the second switching element 120 connected to the magnetoresistance effect element 100 on which data is to be recorded are turned on. When the first switching element 110 and the second switching element 120 are turned on, a write current flows in the wiring 20. When the write current flows through the wiring 20, the spin Hall effect occurs, and a spin is injected into the first ferromagnetic layer 1. The spin injected into the first ferromagnetic layer 1 applies a spin orbit torque (SOT) to the magnetization of the first ferromagnetic layer 1 to change an orientation direction of the magnetization of the first ferromagnetic layer 1. When a flowing direction of the current is reversed, a direction of the spin injected into the first ferromagnetic layer 1 is reversed, and thus an orientation direction of the magnetization can be freely controlled.

The resistance value of the laminated body 10 in the laminating direction is small when the magnetization of the first ferromagnetic layer 1 and the magnetization of the second ferromagnetic layer 2 are parallel to each other, and the resistance value becomes large when the magnetization of the first ferromagnetic layer 1 and the magnetization of the second ferromagnetic layer 2 are antiparallel. Data is recorded in the magnetoresistance effect element 100 as a resistance value in the laminating direction of the laminated body 10.

Next, an operation of reading data from the magnetoresistance effect element 100 will be described. First, the first switching element 110 or the second switching element 120 and the third switching element 130, which are connected to the magnetoresistance effect element 100 for recording date, are turned on. When each of the switching elements is set in this way, a read current flows in the laminating direction of the laminated body 10. When the resistance value in the laminating direction of the laminated body 10 is different according to Ohm's law, an output voltage is different.

Therefore, for example, the data recorded in the magnetoresistance effect element 100 can be read by reading a voltage in the laminating direction of the laminated body 10.

In the magnetoresistance effect element 100 according to the first embodiment, the local concentration of the electric potential is reduced by the first high resistance layer 50 and the second high resistance layer 60, and the wiring is less likely to deteriorate. The reason for this will be described in detail below.

When the magnetoresistance effect element 100 does not have the first high resistance layer 50 and the second high resistance layer 60, the first conductive part 30 and the second conductive part 40 are connected to the wiring 20. The first conductive part 30 and the second conductive part 40 often have lower electrical resistivity than the wiring 20. In the wiring 20, an electric potential difference is strong in the shortest distance between the first conductive part 30 and the second conductive part 40. Therefore, the electric potential is concentrated in an end portion of the interface between the wiring 20 and the first conductive part 30 on the second conductive part 40 side and an end portion of the interface between the wiring 20 and the second conductive part 40 on the first conductive part 30 side. Also, these end portions coincide with corners in which the electric potential is easily concentrated.

On the other hand, when the magnetoresistance effect element 100 has the first high resistance layer 50 and the second high resistance layer 60, the first high resistance layer 50 and the second high resistance layer 60 serve as electric potential buffers. Since the first high resistance layer 50 and the second high resistance layer 60 have high resistance, the electric potential difference in the in-plane direction becomes small. Therefore, when the magnetoresistance effect element 100 does not have the first high resistance layer 50 and the second high resistance layer 60, the electric potential difference strongly generated in the shortest distance between the first conductive part 30 and the second conductive part 40 is reduced in the in-plane direction by the first high resistance layer 50 and the second high resistance layer 60. That is, the first high resistance layer 50 and the second high resistance layer 60 curb the local concentration of the electric potential.

In addition, since the first high resistance layer 50 and the second high resistance layer 60 have higher electrical resistivity than the wiring 20, the electric potential is easily concentrated at the interfaces between the first conductive part 30 and the first high resistance layer 50 and between the second conductive part 40 and the second high resistance layer 60 more than at the interfaces between the wiring 20 and the first high resistance layer 50 and the second high resistance layer 60. The interfaces between the first conductive part 30 and the first high resistance layer 50 and between the second conductive part 40 and the second high resistance layer 60 are displaced from a corner Ed in which the electric potential is concentrated. Thus, the places in which the electric potential is easily concentrated are dispersed, and the local concentration of the electric potential is curbed.

The local concentration of the electric potential causes deterioration of the wiring due to electromigration or the like. In the magnetoresistance effect element 100 according to the first embodiment, the local concentration of the electric potential is reduced by the first high resistance layer 50 and the second high resistance layer 60, and the deterioration of the wiring is curbed.

Although an example of the first embodiment has been described so far, the present invention is not limited to this example.

Figure 5:
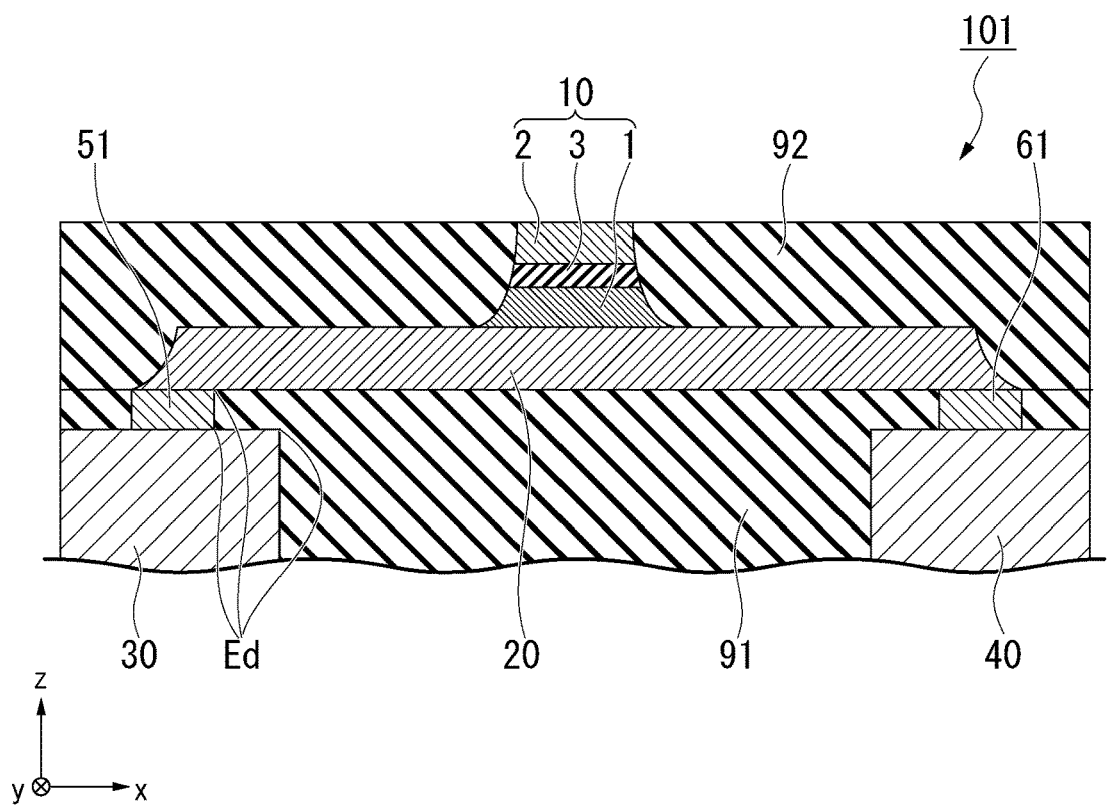
FIG. 5 is a cross-sectional view of a spin element according to a first modified example.
Figure 6:
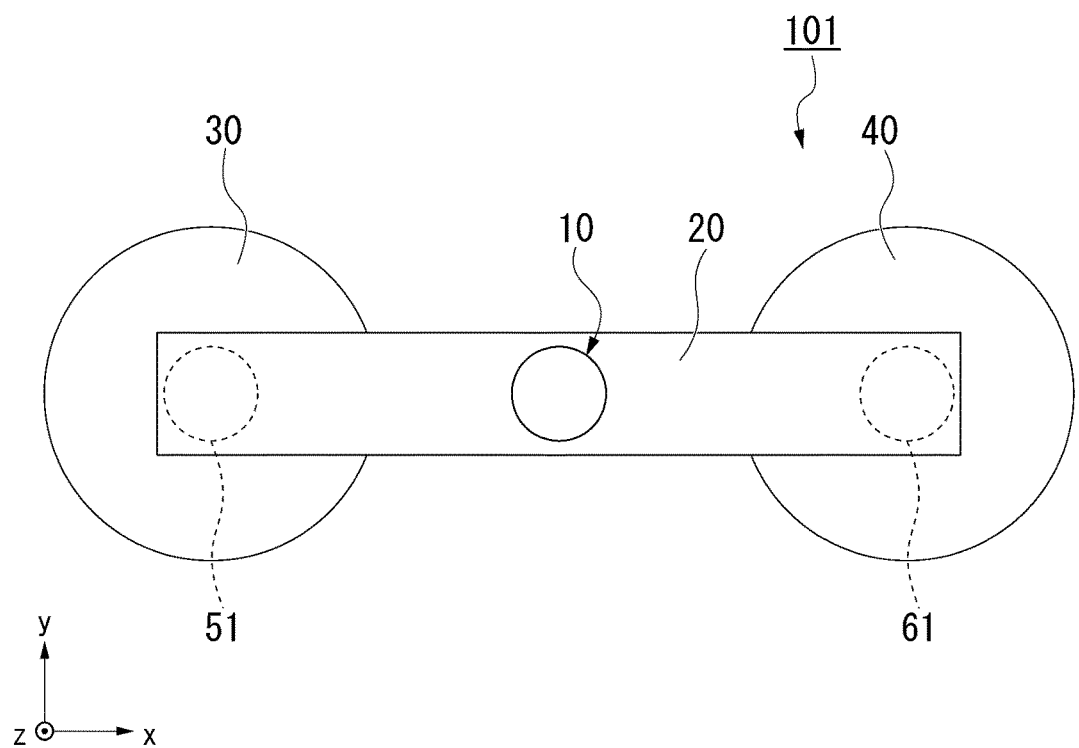
FIG. 6 is a plan view of the spin element according to the first modified example.

FIG. 5 is a cross-sectional view of a magnetoresistance effect element 101 according to the first modified example. FIG. 6 is a plan view of the magnetoresistance effect element 101 according to the first modified example. FIG. 5 is a cross section of the magnetoresistance effect element 101 along the xz plane through the center of the width of the wiring 20 in the y direction.

The magnetoresistance effect element 101 according to the first modified example is different from the magnetoresistance effect element 100 according to the first embodiment in that the side surface of the first high resistance layer 51 and the side surface of the first conductive part 30 are discontinuous, and the side surface of the second high resistance layer 61 and the side surface of the second conductive part 40 are discontinuous. Components that are the same as those of the magnetoresistance effect element 100 are designated by the same reference numerals, and a description thereof will be omitted.

The perimeter of the first high resistance layer 51 is smaller than that of the first conductive part 30, and the perimeter of the second high resistance layer 61 is smaller than that of the second conductive part 40. The first high resistance layer 51 is included in the first conductive part 30 and the second high resistance layer 61 is included in the second conductive part 40 in a plan view in the z direction. Since the first conductive part 30 and the second conductive part 40 are connected to the transistor Tr, a size thereof is on the order of microns to millimeters. On the other hand, the laminated body 10 has a nano to micron size. Since the first high resistance layer 51 and the second high resistance layer 61 are smaller than the first conductive part 30 and the second conductive part 40, it becomes easy to adjust a difference in the size between them. Further, since there are a plurality of corners Ed in which the current is easily concentrated, it is possible to curb local concentration of a current in one place. Further, flatness of a surface on which the wiring 20 is laminated is improved by matching a hardness of the first high resistance layer 51 and the second high resistance layer 61 with that of the insulating layer 91.

Figure 7:
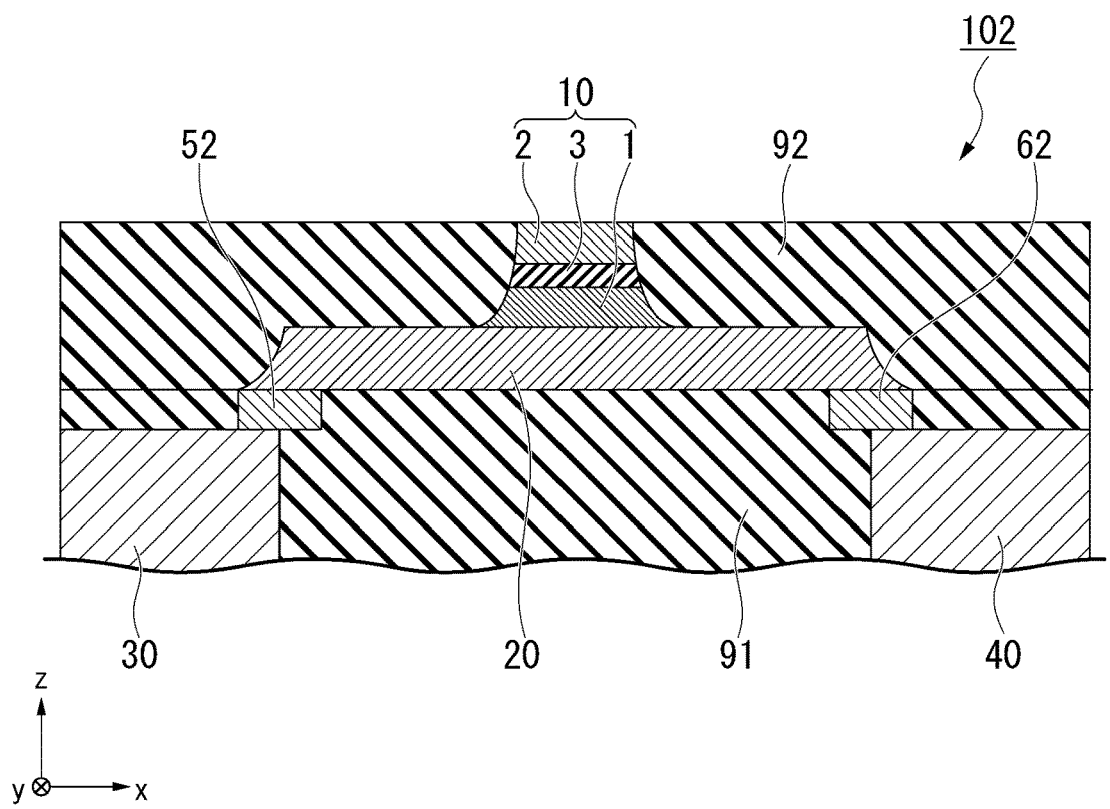
FIG. 7 is a cross-sectional view of a spin element according to a second modified example.
Figure 8:
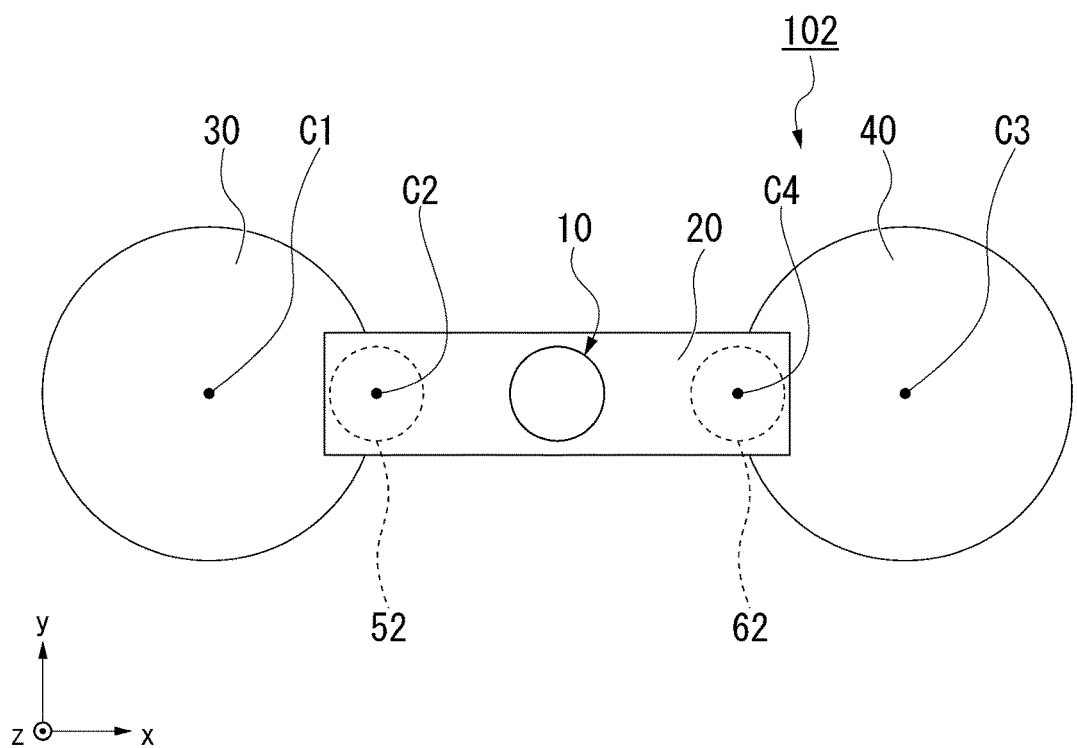
FIG. 8 is a plan view of the spin element according to the second modified example.

FIG. 7 is a cross-sectional view of a magnetoresistance effect element 102 according to a second modified example. FIG. 8 is a plan view of the magnetoresistance effect element 102 according to the second modified example. FIG. 7 is a cross section of the magnetoresistance effect element 102 along the xz plane through the center of the width of the wiring 20 in the y direction.

The magnetoresistance effect element 102 according to the second modified example is different from the magnetoresistance effect element 101 according to the first modified example in that a center C1 of the first conductive part 30 and a center C2 of the first high resistance layer 52 are displaced from each other, and a center C3 of the second conductive part 40 and a center C4 of the second high resistance layer 62 are displaced from each other. Components that are the same as those of the magnetoresistance effect element 101 are designated by the same reference numerals, and the description thereof will be omitted.

The perimeter of the first high resistance layer 52 is smaller than that of the first conductive part 30, and the perimeter of the second high resistance layer 62 is smaller than that of the second conductive part 40. When seen in the z direction, the center C2 of the first high resistance layer 52 is closer to the laminated body 10 than the center C1 of the first conductive part 30, and the center C4 of the second high resistance layer 62 is closer to the laminated body 10 than the center C3 of the second conductive part 40.

Since the first conductive part 30 and the second conductive part 40 are connected to the transistor Tr, a distance between the first conductive part 30 and the second conductive part 40 cannot be freely changed. For example, the transistor Tr has a prescribed minimum feature size, and it is difficult to make the distance between the first conductive part 30 and the second conductive part 40 equal to or smaller than the minimum feature size. The first high resistance layer 52 and the second high resistance layer 62 are in different layers from the transistor Tr, and their positional relationship can be freely changed. When the first high resistance layer 51 and the second high resistance layer 62 are brought closer to the laminated body 10, a length of the wiring 20 becomes shorter. The wiring 20 includes a heavy metal and easily generates heat. The diffusion of elements into other layers can be further curbed by making a heat source small.

Figure 9:
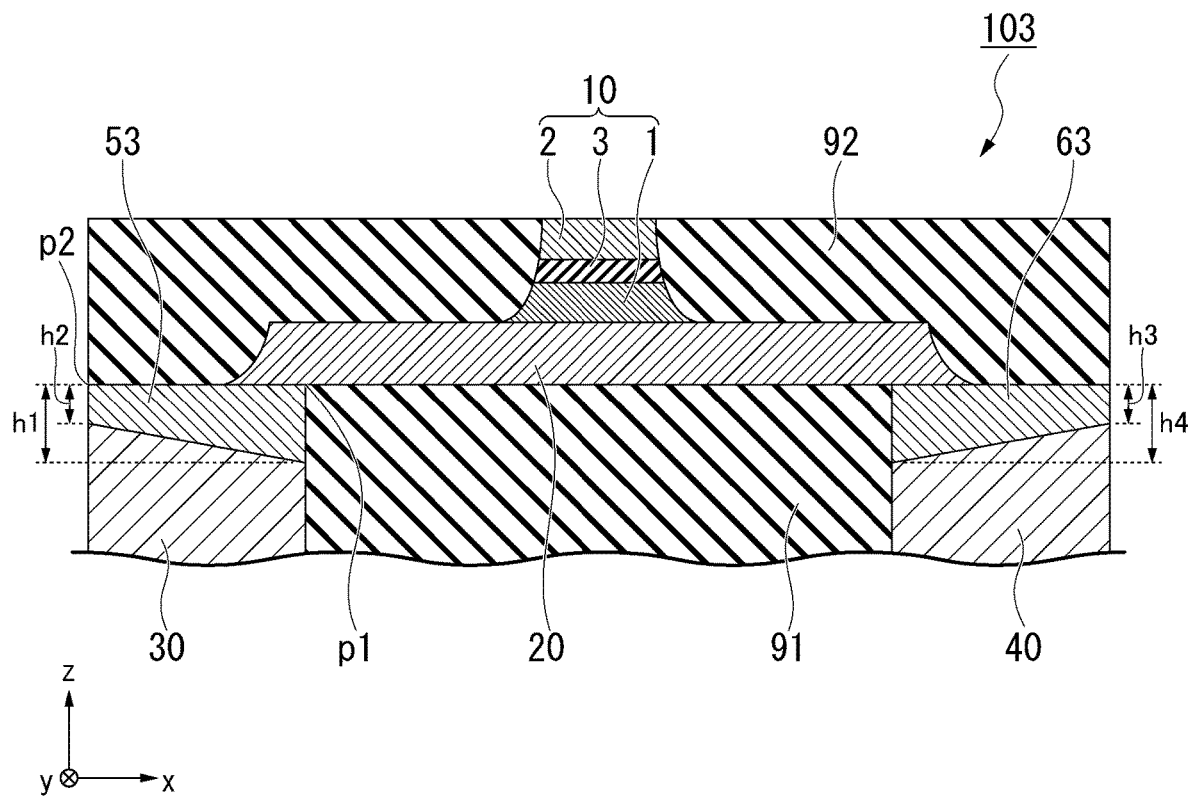
FIG. 9 is a cross-sectional view of a spin element according to a third modified example.

FIG. 9 is a cross-sectional view of a magnetoresistance effect element 103 according to a third modified example. FIG. 9 is a cross section of the magnetoresistance effect element 103 along the xz plane through the center of the width of the wiring 20 in the y direction.

The magnetoresistance effect element 103 according to the third modified example is different from the magnetoresistance effect element 100 according to the first embodiment in that film thicknesses of the first high resistance layer 53 and the second high resistance layer 63 are not constant in the in-plane direction. Components that are the same as those of the magnetoresistance effect element 100 are designated by the same reference numerals, and the description thereof will be omitted.

A thickness h1 of the first high resistance layer 53 at a first point p1 is thicker than a thickness thereof at a second point p2. The second point p2 is farther from the first ferromagnetic layer 1 than the first point p1. As described above, in the wiring 20, the electric potential difference is strong in the shortest distance between the first conductive part 30 and the second conductive part 40. Therefore, the electric potential is more easily concentrated at the first point p1 than at the second point p2. Since a thickness of a portion in which the electric potential is easily concentrated is large, the local concentration of the electric potential is further reduced, and the deterioration of the wiring is curbed.

Figure 10:
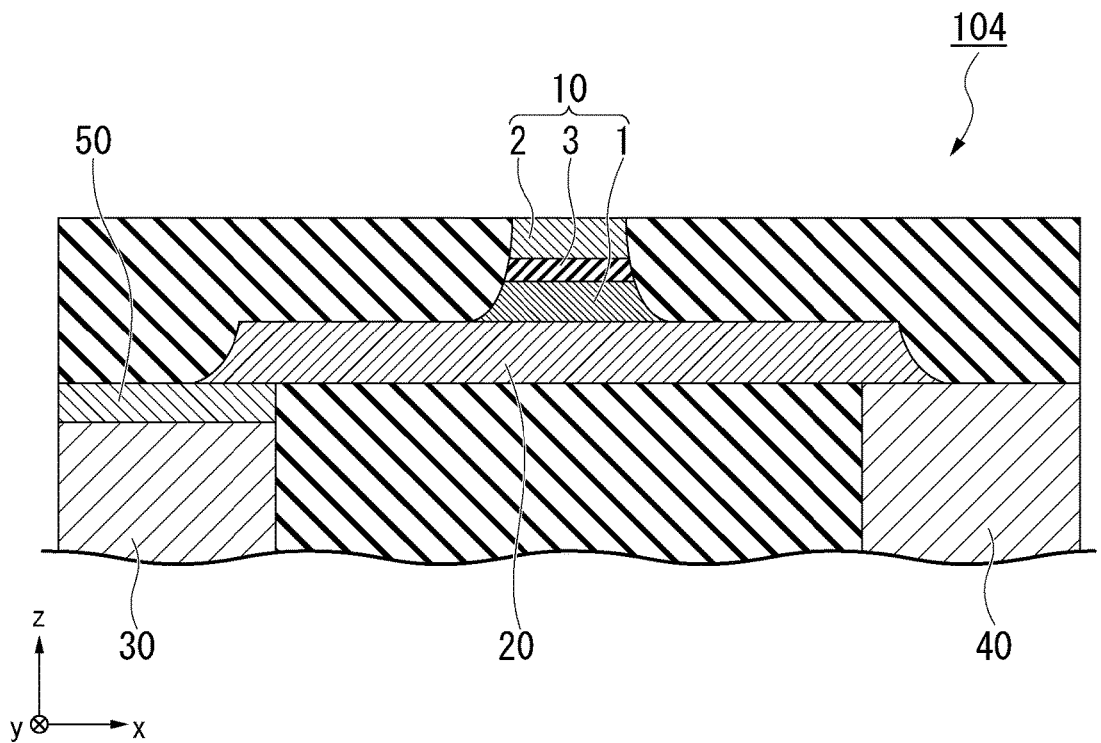
FIG. 10 is a cross-sectional view of a spin element according to a fourth modified example.

FIG. 10 is a cross-sectional view of a magnetoresistance effect element 104 according to a fourth modified example. FIG. 10 is a cross section of the magnetoresistance effect element 104 along the xz plane through the center of the width of the wiring 20 in the y direction.

The magnetoresistance effect element 104 according to the fourth modified example is different from the magnetoresistance effect element 100 according to the first embodiment in that the second high resistance layer 60 is not provided between the second conductive part 40 and the wiring 20. The first high resistance layer 50 prevents the deterioration of the wiring of the first conductive part 30.

Second Embodiment

Figure 11:
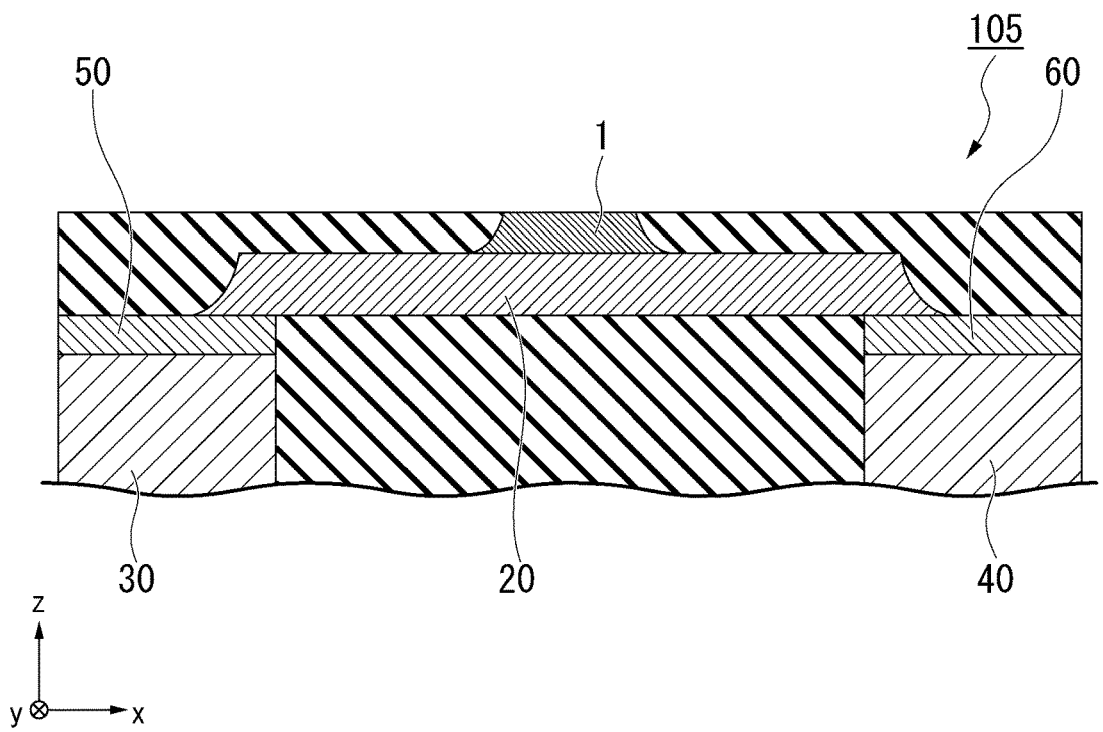
FIG. 11 is a cross-sectional view of a spin element according to a second embodiment.

FIG. 11 is a cross-sectional view of a magnetization rotational element 105 according to a second embodiment. FIG. 11 is a cross section of the magnetoresistance effect element 100 along the xz plane through the center of the width of the wiring 20 in the y direction. The magnetization rotational element 105 according to the second embodiment is different from the magnetoresistance effect element 100 according to the first embodiment in that it does not have the nonmagnetic layer 3 and the second ferromagnetic layer 2. The other constitutions are the same as those of the magnetoresistance effect element 100 according to the first embodiment, and a description thereof will be omitted.

The magnetization rotational element 105 is an example of the spin element. The magnetization rotational element 105, for example, causes light to be incident on the first ferromagnetic layer 1 and evaluates light reflected by the first ferromagnetic layer 1. When the orientation direction of the magnetization changes due to a magnetic Kerr effect, a deflection state of the reflected light changes. The magnetization rotational element 105 can be used as an optical element of, for example, an image display device which utilizes a difference in the deflection state of light.

In addition, the magnetization rotational element 105 can also be used alone as an anisotropic magnetic sensor, an optical element using a magnetic Faraday effect, or the like.

The magnetization rotational element 105 according to the second embodiment only has a structure in which the nonmagnetic layer 3 and the second ferromagnetic layer 2 are removed, and can obtain the same effects as the magnetoresistance effect element 100 according to the first embodiment. Moreover, the same modified examples as those of the magnetoresistance effect element 100 according to the first embodiment can be selected.

Third Embodiment

Figure 12:
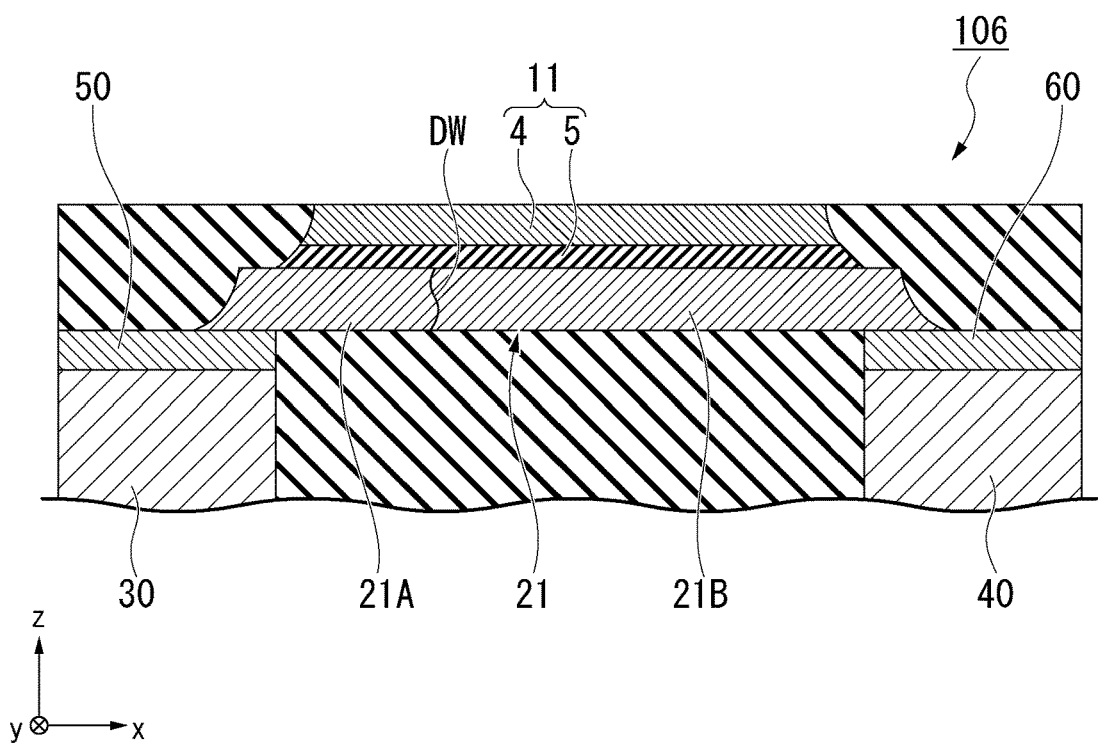
FIG. 12 is a cross-sectional view of a spin element according to a third embodiment.

FIG. 12 is a sectional view of a magnetoresistance effect element 106 according to a third embodiment. FIG. 12 is a cross section of the magnetoresistance effect element 106 along the xz plane through the center of the width of the wiring 21 in the y direction. The magnetoresistance effect element 106 is different from the magnetoresistance effect element 100 in that the laminated body 11 includes the nonmagnetic layer 5 and the first ferromagnetic layer 4 from the side closer to the wiring 21. Components that are the same as those of the magnetoresistance effect element 100 are designated by the same reference numerals, and a description thereof will be omitted.

The magnetoresistance effect element 106 includes the laminated body 11, the wiring 21, the first conductive part 30, the second conductive part 40, the first high resistance layer 50, and the second high resistance layer 60. The laminated body 11 includes the nonmagnetic layer 5 and the first ferromagnetic layer 4 from the side closer to the wiring 21. The magnetoresistance effect element 106 is an element of which a resistance value changes with movement of a magnetic domain wall DW, and may be referred to as a magnetic domain wall movement element or a magnetic domain wall movement type magnetoresistance effect element.

The wiring 21 is a magnetic layer. The wiring 21 includes a ferromagnetic material. As a magnetic material constituting the wiring 21, a metal selected from the group consisting of Cr, Mn, Co, Fe and Ni, an alloy containing one or more of these metals, an alloy containing these metals and at least one or more elements of B, C and N, or the like can be used. Specifically, Co—Fe, Co—Fe—B, and Ni—Fe may be used.

The wiring 21 is a layer in which information can be magnetically recorded by a change in an internal magnetic state. The wiring 21 has a first magnetic domain 21A and a second magnetic domain 21B therein. The magnetization of the first magnetic domain 21A and the magnetization of the second magnetic domain 21B are oriented in opposite directions, for example. A boundary between the first magnetic domain 21A and the second magnetic domain 21B is the magnetic domain wall DW. The wiring 21 can have the magnetic domain wall DW therein.

The magnetoresistance effect element 106 can record data in multiple values or continuously according to a position of the magnetic domain wall DW of the wiring 21. The data recorded in the wiring 21 is read as a change in the resistance value of the magnetoresistance effect element 106 when the read current is applied.

The magnetic domain wall DW moves due to the write current being caused to flow in the x direction of the wiring 21 or application of an external magnetic field. For example, when the write current (for example, a current pulse) is applied to the wiring 21 in the +x direction, electrons flow in the −x direction which is opposite to the current, and thus the magnetic domain wall DW moves in the −x direction. When a current flows from the first magnetic domain 21A toward the second magnetic domain 21B, the electrons spin-polarized in the second magnetic domain 21B reverse the magnetization of the first magnetic domain 21A. When the magnetization of the first magnetic domain 21A is reversed, the magnetic domain wall DW moves in the −x direction.

The first ferromagnetic layer 4 and the nonmagnetic layer 5 are respectively the same as the first ferromagnetic layer 1 and the nonmagnetic layer 3 according to the first embodiment.

The magnetoresistance effect element 106 according to the third embodiment can also obtain the same effect as the magnetoresistance effect element 100 according to the first embodiment. Moreover, the same modified examples as those of the magnetoresistance effect element 100 according to the first embodiment can be selected.

Fourth Embodiment

Figure 13:
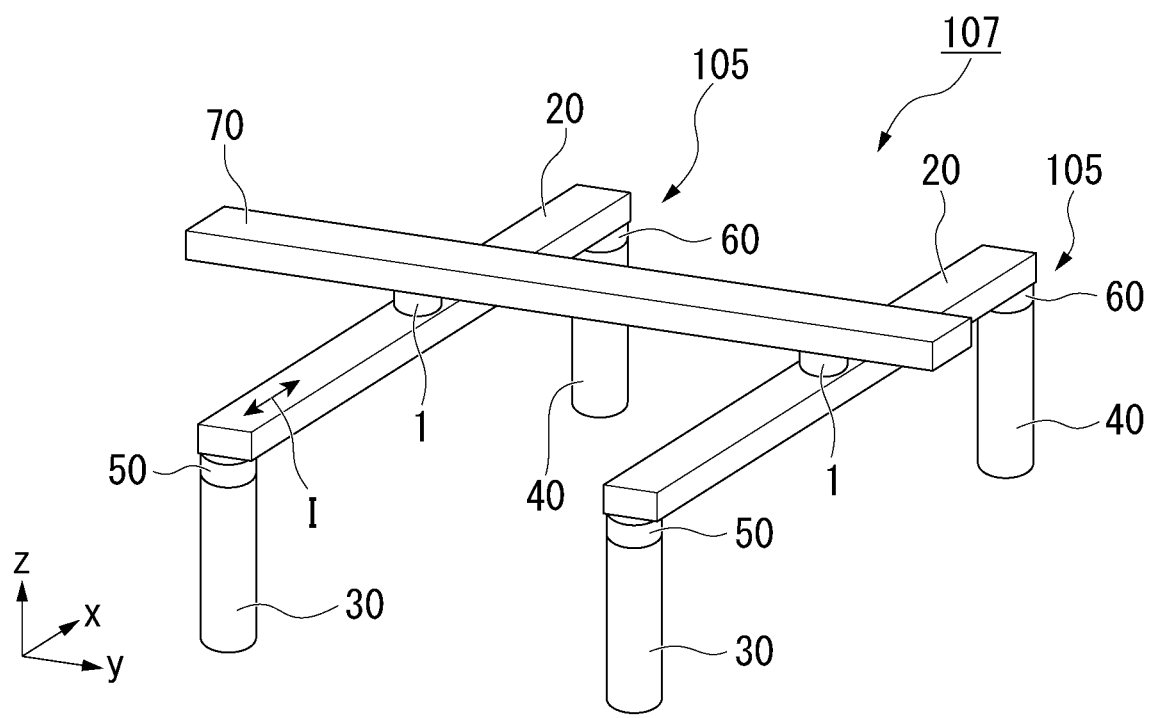
FIG. 13 is a perspective view of a reservoir element according to a fourth embodiment.

FIG. 13 is a perspective view of a reservoir element 107 according to a fourth embodiment. The reservoir element 107 includes a plurality of magnetization rotational elements 105, and a spin conductive layer 70 which connects the first ferromagnetic layers 1 of the plurality of magnetization rotational elements 105. The spin conductive layer 70 is formed of, for example, a nonmagnetic conductor. The spin conductive layer 70 propagates the spin current leaked from the first ferromagnetic layer 1.

The reservoir element is an element used in a reservoir computer which is one of neuromorphic elements. A neuromorphic element is an element which imitates the human brain with a neural network. The neuromorphic element is used, for example, as a recognizer. For example, the recognizer recognizes (image recognition) and classifies an input image.

The reservoir element 107 converts an input signal input thereto into another signal. Within reservoir element 107, the signals only interact, and is not learning. When the input signals interact with each other, the input signals change non-linearly. That is, the input signal is replaced with another signal while original information is retained. The input signals change over time by interacting with each other within the reservoir element 107. In the reservoir element 107, the first ferromagnetic layers 1 corresponding to a plurality of neurons are mutually connected. Therefore, for example, a signal output from a neuron at a certain time t may return to an original neuron at a certain time t+1. The neuron can perform processing based on the signals at time t and time t+1 and can recursively process information.

The spin conductive layer 70 is, for example, a metal or a semiconductor. A metal used for the spin conductive layer 70 is, for example, a metal or an alloy containing any element selected from the group consisting of Cu, Ag, Al, Mg, and Zn. A semiconductor used for the spin conductive layer 70 is, for example, a simple substance or an alloy of any element selected from the group consisting of Si, Ge, GaAs, and C. For example, Si, Ge, a Si—Ge compound, GaAs, graphene, or the like may be used.

When a current I flows through the wiring 20, the spin is injected into the first ferromagnetic layer 1 and the spin orbit torque is applied to the magnetization of the first ferromagnetic layer 1. When a high-frequency current is applied to the wiring 20, a direction of the spin injected into the first ferromagnetic layer 1 changes and the magnetization of the first ferromagnetic layer 1 oscillates.

The spin current reaches the spin conductive layer 70 from the first ferromagnetic layer 1. Since the magnetization of the first ferromagnetic layer 1 oscillates, the spin current flowing through the spin conductive layer 70 also oscillates in response to the magnetization. The spin accumulated at the interface between the first ferromagnetic layer 1 and the spin conductive layer 70 propagates in the spin conductive layer 70 as a spin current.

The spin currents generated by the respective magnetizations of the two first ferromagnetic layers 1 merge and interfere with each other in the spin conductive layer 70. The interference of the spin current affects the oscillation of the magnetization of each of the first ferromagnetic layers 1, and the oscillation of the magnetizations of the two first ferromagnetic layers 1 resonates. Oscillation phases of the two magnetizations are synchronized or shifted by a half wavelength (ii).

When the application of the current I to the wiring 20 is stopped, the oscillation of the magnetization of the first ferromagnetic layer 1 is stopped. The magnetization of the first ferromagnetic layer 1 after resonance becomes parallel or antiparallel. When the phases of the two oscillations are synchronized, the directions of the two magnetizations are aligned and parallel. When the phases of the two oscillations are shifted by a half wavelength ($\pi$), the directions of the two magnetizations are opposite and antiparallel.

When the magnetizations of the two first ferromagnetic layers 1 are parallel, the resistance value of the reservoir element 107 is smaller than when it is antiparallel. The reservoir element 107 outputs, for example, information of "1" when the resistance value of the reservoir element 107 is large (when the two magnetizations are antiparallel) and information of "0" when it is small (when the two magnetizations are parallel).

The current I input to the wiring 20 has a variety of information. For example, the information includes a frequency of the current I, a current density, a current amount, and the like. On the other hand, the reservoir element 107 outputs information of "1" and "0" as the resistance value. That is, the reservoir element 107 according to the first embodiment converts information by converting the oscillation of the magnetizations of the plurality of first ferromagnetic layers 1 into the spin currents and interfering with each other in the spin conductive layer 70.

The reservoir element 107 according to the fourth embodiment can also obtain the same effects as the magnetoresistance effect element 100 according to the first embodiment. Moreover, the same modified examples as those of the magnetoresistance effect element 100 according to the first embodiment can be selected.

Although preferred exemplary aspects of the present invention have been provided above based on the first to fourth embodiments, the present invention is not limited to these embodiments. For example, the characteristic constitution of each of the embodiments may be applied to other embodiments.

REFERENCE SIGNS LIST 1, 4 First ferromagnetic layer
2 Second ferromagnetic layer
3, 5 Nonmagnetic layer
10, 11 Laminated body
20, 21 Wiring
20a First surface
20b Second surface
21A First magnetic domain
21B Second magnetic domain
30 First conductive part
40 Second conductive part
50, 51, 52 First high resistance layer
60, 61, 62 Second high resistance layer
70 Spin conductive layer
90, 91, 92 Insulating layer
100, 101, 102, 103, 104, 106 Magnetoresistance effect element
105 Magnetization rotational element
107 Reservoir element
110 First switching element
120 Second switching element
130 Third switching element
200 Magnetic recording array
C1, C2, C3, C4 Center
Cm1 to Cmn Common wiring
Cw Conductive part
D Drain
E Conductive layer
G Gate electrode
GI Gate insulating film
Rp1 to Rpn Read wiring
S Source
Sub Substrate
Tr Transistor
Wp1 to Wpn Write wiring

What is claimed is:

1. A spin element comprising:
   a wiring that extends in a plane and has a length in a first direction that is longer than a width of the wiring in a second direction that is perpendicular to the first direction;
   a laminated body including a first ferromagnetic layer laminated on the wiring;
   a first conductive part and a second conductive part which sandwich the first ferromagnetic layer in a plan view in a laminating direction; and
   a first high resistance layer which is in physical contact with the wiring and the first conductive part and is disposed between the first conductive part and the wiring, the first high resistance layer having an electrical resistivity equal to or higher than that of the wiring,
   wherein:
   the first conductive part and the second conductive part have lower electrical resistivity than the wiring, and
   a perimeter of the first high resistance layer is smaller than a perimeter of the first conductive part.

2. The spin element according to claim 1, wherein:
   the first high resistance layer is included in the first conductive part in a plan view in the laminating direction.

3. The spin element according to claim 1, wherein:
   a center of the first high resistance layer is closer to the first ferromagnetic layer than a center of the first conductive part in a plan view in the laminating direction.

4. The spin element according to claim 1, wherein materials which constitute the first high resistance layer and the wiring are the same.

5. The spin element according to claim 1, wherein an interface between the first high resistance layer and the wiring has unevenness of one atomic layer or more.

6. The spin element according to claim 1, wherein a thickness of the first high resistance layer at a first point is thicker than a thickness thereof at a second point farther from the first ferromagnetic layer than the first point.

7. The spin element according to claim 1, further comprising a second high resistance layer which is in contact with the wiring and is disposed between the second conductive part and the wiring, the second high resistance layer having an electrical resistivity equal to or higher than that of the wiring.

8. The spin element according to claim 1, wherein:
   the laminated body is formed of the first ferromagnetic layer, and
   the wiring is any one of a metal, an alloy, an intermetallic compound, a metal boride, a metal carbide, a metal silicide, and a metal phosphide which have a function of generating a spin current by a spin Hall effect when a current flows.

9. A reservoir element comprising:
   a plurality of spin elements according to claim 8; and
   a spin conductive layer which connects the first ferromagnetic layers of the plurality of spin elements.

10. The spin element according to claim 1, wherein:
    the laminated body includes the first ferromagnetic layer, a nonmagnetic layer, and a second ferromagnetic layer from a side close to the wiring, and
    the wiring is any one of a metal, an alloy, an intermetallic compound, a metal boride, a metal carbide, a metal silicide, and a metal phosphide which have a function of generating a spin current by a spin Hall effect when a current flows.

11. The spin element according to claim 1, wherein:
    the laminated body includes a nonmagnetic layer, and the first ferromagnetic layer from a side close to the wiring, and
    the wiring is a ferromagnetic layer which is able to have a magnetic domain wall therein.

* * * * *